US006835528B2

United States Patent
Rottstegge

(12) United States Patent
(10) Patent No.: US 6,835,528 B2
(45) Date of Patent: Dec. 28, 2004

(54) FLUORINE-CONTAINING PHOTORESIST HAVING REACTIVE ANCHORS FOR CHEMICAL AMPLIFICATION AND IMPROVED COPOLYMERIZATION PROPERTIES

(75) Inventor: Jörg Rottstegge, Lilienthal (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/356,791

(22) Filed: Jan. 31, 2003

(65) Prior Publication Data

US 2003/0157432 A1 Aug. 21, 2003

(30) Foreign Application Priority Data

Jan. 31, 2002 (DE) .......................................... 102 03 838

(51) Int. Cl.[7] .............................. G03C 1/73; G03F 7/039
(52) U.S. Cl. .................... 430/270.1; 430/905; 430/907; 430/910; 430/909; 430/325; 430/326; 430/914
(58) Field of Search .............................. 430/270.1, 905, 430/907, 910, 909, 325, 326, 914

(56) References Cited

U.S. PATENT DOCUMENTS

| | | | |
|---|---|---|---|
| 5,234,793 A | 8/1993 | Sebald et al. | 430/323 |
| 5,234,794 A | 8/1993 | Sebald et al. | 430/325 |
| 6,509,134 B2 * | 1/2003 | Ito et al. | 430/270.1 |
| 2003/0152864 A1 * | 8/2003 | Araki et al. | 430/270.1 |

FOREIGN PATENT DOCUMENTS

| | | |
|---|---|---|
| EP | 0 395 917 B1 | 11/1990 |
| EP | 1 103 856 A1 | 5/2001 |

* cited by examiner

Primary Examiner—Cynthia H. Kelly
Assistant Examiner—Sin J. Lee
(74) Attorney, Agent, or Firm—Laurence A. Greenberg; Werner H. Stemer; Ralph E. Locher

(57) ABSTRACT

A photoresist which has high transparency at a wavelength of 157 nm and which therefore permits a greater layer thickness in photolithographic processes for the production of microchips. The photoresist includes a polymer that is prepared from a first fluorinated comonomer that includes a group cleavable under acid catalysis, a second comonomer that includes an anchor group, and a third comonomer whose degree of fluorination is tailored to the second comonomer so that at least one of the comonomers acts as an electron donor and the others act as electron acceptors in the free radical polymerization. Thus, in spite of a high degree of fluorination, the polymer can be prepared in a simple manner and in high yield.

14 Claims, No Drawings

FLUORINE-CONTAINING PHOTORESIST HAVING REACTIVE ANCHORS FOR CHEMICAL AMPLIFICATION AND IMPROVED COPOLYMERIZATION PROPERTIES

BACKGROUND OF THE INVENTION

Field of the Invention

The invention relates to a chemically amplified photoresist that has increased transparency at a wavelength of 157 nm.

Microchips are produced in a large number of operations in which modifications are made in a targeted manner within a small section of the surface of a substrate, generally a silicon wafer, in order, for example, to introduce trenches for deep-trench capacitors into the substrate or to deposit thin conductor tracks or electrodes on the substrate surface. To be able to produce such small structures, a mask is first produced on the substrate surface so that those parts that are to be processed are bare while the other parts are protected by the material of the mask. After the processing, the mask is removed from the substrate surface, for example by ashing. The mask is produced by first applying a thin layer of a photoresist which contains a film-forming polymer and a photosensitive compound. This film is then exposed, a mask which contains the information relating to the structure to be produced and through which a selective exposure of the photoresist film is effected being introduced, for example, into the beam path. Owing to diffraction effects, the smallest producible structure size is substantially determined by the wavelength of the radiation used for the exposure.

To be able to keep pace with increasing requirements with regard to the computational power of microprocessors and storage capacity of memory modules, there is a need to develop, in increasingly short periods, microchips having an increasingly high density of components and hence increasingly small structures. To be able to produce structure sizes in the range from 100 to 70 nm, below the currently obtainable dimensions, it is necessary to develop novel processes since the processes currently used industrially for the production of very fine structures and based on radiation having a wavelength of 193 nm are reaching the limits of the resolutions to be realized.

Extensive know-how has been acquired in the structuring of microchips using lithographic processes. To be able to continue using this knowledge, work has been carried out particularly intensively on a further development of the known lithographic processes for an exposure wavelength of 157 nm. The development of novel photoresists is required for this purpose, since the materials used to date for wavelengths of 248 nm and 193 nm are unsuitable for a wavelength of 157 nm.

The poor transparency of the materials used to date presents a particular difficulty. The transparency of the resist is influenced primarily by the polymer that is contained in the resist. The best polymers currently used in photoresists achieve an absorption coefficient of about $\mu_{10}=1/\mu m$ at a wavelength of 157 nm. At an exposure wavelength of 157 nm, these polymers thus still have an absorption that is about 50 times higher compared with polymers that are used for exposures with radiation having a wavelength of 193 or 248 nm. For this reason, it has been possible to date to realize only very thin resist layers having layer thicknesses of not more than 50 nm in the case of the 193 nm and 248 nm materials, giving rise to problems with the structuring of the material underneath. To be able to produce a mask structure without errors, complete chemical modification of the polymer must be initiated during the exposure, even in the deeper parts of the photoresist layer. For this purpose, a sufficiently high light intensity must be ensured even in deep layers of the resist. In spite of the thin layers, however, the absorption of these resists is so high that only about 40% of the original light intensity reaches the lowermost resist layer in a 50 nm thin layer. This increases the risk that the resist will exhibit resist feet after development. The use of such a small layer thickness gives rise to further problems. Thus, the defect density in the thin layers increases with decreasing layer thickness. In addition, the small volume of resist material makes the ultrathin resist layers susceptible to contamination. The structures produced with these ultrathin layers using an exposure wavelength of 157 nm therefore have very rough edges and a limited structure resolution. Therefore, a first requirement which a novel photoresist should meet is as high a polymer transparency as possible at a wavelength of 157 nm.

A further problem is sufficient stability of the photoresist for radiation having a wavelength of 157 nm. In the polymers contained in photoresists used to date, silicon-containing groups are present for increasing the etch stability to an oxygen plasma. As a result of the high energy of an exposure radiation having a wavelength of 157 nm, however, bonds may be broken in the polymer. This leads to expulsion of silicon-containing compounds in gaseous form, which form irreversible deposits on the optical systems of the exposure unit. A polymer suitable for a photoresist for exposure at 157 nm therefore must not include any silicon-containing side groups.

A photoresist suitable for the industrial production of microchips has to meet a large number of further requirements. For economic reasons, exposure times that are as short as possible desired in the transfer of the structure defined by a mask to the photoresist. To be able to achieve a comprehensive chemical modification of the photoresist even with low exposure intensities, most resists used at present operate with chemical amplification. Here, the exposure initiates a photochemical reaction that catalyzes a change in the chemical structure of the photoresist. In the case of a positive-working chemically amplified resist, for example, the exposure produces a strong acid which effects a catalytic conversion or cleavage of the resist in a subsequent heating step. As a result of this chemical reaction, the solubility of the polymer in a developer is dramatically changed so that a substantial differentiation between exposed and unexposed parts is possible. For this purpose, the polymer contained in the photoresist contains, for example, carboxylic acid tert-butyl ester groups, from which carboxyl groups can be liberated under acid catalysis. In chemically amplified resists, a large number of polar groups therefore can be liberated by an individual photon. In contrast to chemically unamplified photoresists, chemically amplified photoresists therefore have a quantum yield of more than 100%. A novel photoresist must therefore also fulfill the conditions of chemical amplification.

The structured photoresists serve as a rule as a mask for further processes, such as, for example, dry etching processes. There, the structure produced in the photoresist is transferred to a substrate disposed under the photoresist. For this purpose, it is necessary for the photoresist to have a higher stability to the plasma than the substrate, so that only the substrate is etched as selectively as possible. If it is intended to use the photoresist, for example, to structure an organic chemical medium underneath, such as, for example, in two-layer resists, high etch resistance of the structured, upper photoresist is required in comparison with this. The effect of an etch plasma can be divided roughly into a physical part and a chemical part. The physical part effects removal of material virtually independently of the material. The components of the plasma strike the substrate surface and knock out particles there. To achieve a differentiation between sections covered by the resist mask and uncovered sections, the resist mask must therefore have a certain layer thickness so that a sufficient layer thickness of the resist is still present on the covered sections at the end of the etching process in order to protect those sections of the substrate surface which are present underneath. The chemical part of the etching process is based on a different reactivity of the plasma with respect to different materials. Thus, organic materials are converted in an oxygen plasma into gaseous compounds so that rapid removal of material takes place, while organosilicon compounds are converted into silicon dioxide, which remains as a solid on the substrate surface and is removed only by the physical part of the etching effect. Since the etch resistance of organosilicon compounds in the oxygen plasma differs substantially from that of organic hydrocarbon compounds, the polymer in the photoresists used to date for a wavelength of 248 nm therefore generally included silicon-containing groups which are converted into silicon dioxide during the etching to form a stable etch mask. If the etch resistance is absent from the outset because, owing to the above-described expulsion of silicon-containing compounds in gaseous form, no silicon-containing groups can be provided in the polymer, the photoresist can be chemically amplified after the structuring. For this purpose, the polymer contained in the photoresist includes anchor groups for the linkage of amplification reagents which increase the etch resistance of the photoresist. By incorporating further groups, it was simultaneously possible to increase the layer thickness of the photoresist subsequently. The anchor group must have sufficient reactivity to react with a suitable group of the amplification agent within as short a reaction time as possible, in order to bind the agent via a covalent bond to the polymer. Subsequent amplification of photoresists is possible, for example, by the CARL (CARL=Chemical Amplification of Resist Lines) process described in European Patent EP 0 395 917 B1, which corresponds to U.S. Pat. Nos. 5,234,794 and 5,234, 793. For this purpose, for example, maleic anhydride is incorporated as a comonomer into the polymer of the photoresist. The carboxylic anhydride group then serves as an anchor group, which can be nucleophilically attacked, for example, by an amino group of the amplification agent. The amplification agent is then bound to the polymer of the photoresist via an amide bond. For example, subsequent incorporation of organosilicon compounds into the resist structures is possible in this way. This incorporation reaction is often referred to as silylation. In addition to silicon-containing groups, aromatic polycyclic aliphatic groups also may be introduced into the polymer in order to increase the etch resistance. The introduction of aromatic groups is referred to as aromatization. Owing to the small layer thickness, a photoresist for 157 nm lithography should therefore be subsequently chemically amplifiable.

In addition to high photosensitivity, high transparency and the possibility of subsequent chemical amplification, the photoresist must also meet a large number of further requirements. Thus, it must be capable of being formed into a uniform thin film, it must have a sufficiently high glass transition temperature in order to permit reproducible production of structures, and, after cleavage of the acid-labile groups, it must have a sufficiently high polarity to be soluble in the developer. Finally, economic requirements also must be met and the polymer contained in the photoresist must, for example, be capable of being prepared easily and from economical starting materials. However, the totality of the requirements can be met only with difficulty.

For the amplification, corresponding anchor groups must be provided in a photoresist polymer to be developed. However, a disadvantage is that these anchor groups have, as a rule, a very high absorption at a wavelength of 157 nm. This relates in particular to anhydride groups, which are used as anchor groups in the amplification by the CARL process. Thus, for example, the frequently used polymaleic anhydride has a very high absorption coefficient of $\mu_{10}=$ 10.5/$\mu$m at 157 nm.

The absorption at 157 nm is dominated by the C(2p)-electrons, whose absorption band extends very close to 157 nm and whose transition probability can be considerably influenced by the chemical environment. This in turn means that the absorption of the polymer at 157 nm can be reduced by changing the bond environment in the carbon main chain.

By replacing C—H bonds with C—F bonds, a shift in the band edge of the C(2p)-electrons by several electron volts can be achieved. Thus, a 25% replacement of hydrogen by fluorine in specific hydrocarbon resist systems leads to a shift of the absorption band from 2.5–4 $\mu$m$^{-1}$ to 1.5–3 $\mu$m$^{-1}$, while a 50% replacement leads to a further reduction of the absorption into the 1.5–3 $\mu$m$^{-1}$ range. Such low absorption values permit a resist thickness of over 200 nm since the possible resist layer thickness is inversely proportional to the absorption.

In order to increase the transparency of the polymer contained in the photoresist, attempts have therefore been made to use fluorinated monomers as starting materials. However, this leads to difficulties in the preparation of the polymer. The polymer is generally prepared by free radical polymerization from monomers that have a polymerizable carbon-carbon double bond. As a result of the effect of the fluorine atoms, the electron density of the double bond is reduced so that its reactivity decreases considerably. Fluorinated carboxylic anhydrides, such as difluoromaleic anhydride or trifluoromethylmaleic anhydride, can therefore be polymerized only with very great difficulty.

SUMMARY OF THE INVENTION

It is accordingly an object of the invention to provide a fluorine-containing photoresist having reactive anchors for chemical amplification and improved copolymerization properties that overcomes the hereinafore-mentioned disadvantages of the heretofore-known devices of this general type and that has high transparency at a wavelength of 157 nm, is chemically amplified, can be subsequently chemically modified, and can be produced easily and economically.

With the foregoing and other objects in view, there is provided, in accordance with the invention, a chemically amplified photoresist featuring at least a film-forming fluorine containing polymer, a photo acid generator, and a solvent or solvent mixture. The film-forming fluorine-containing polymer is obtained by copolymerization of at least one first fluorine-containing comonomer having a polymerizable carbon-carbon double bond and at least one group cleavable under acid catalysis, one second comonomer having a polymerizable carbon-carbon double bond, and at least one nucleophilically attackable anchor group for binding an amplification agent, and at least one third comonomer. It is possible for the anchor group also to be present as a protected anchor group. The at least one third comonomer has exactly one (i.e. one and only one) polymerizable carbon-carbon double bond and an otherwise saturated carbon skeleton, which includes no group cleavable under acid catalysis and no anchor group. One of the second and third comonomers is substituted by fluorine atoms so that the polymerizable carbon-carbon double bond is electron-poor and acts as an electron acceptor in the polymerization. The other of the second and third comonomers has a polymerizable carbon-carbon double bond that is electron-rich and acts as an electron donor in the polymerization.

The polymer contained in the photoresist according to the invention has a high degree of fluorination and hence improved transparency at a wavelength of 157 nm. By simultaneous use of comonomers having an electron-rich and an electron-poor polymerizable carbon-carbon double bond, the problem of poor polymerizability of the fluorinated monomers can be solved. The polymerization of the comonomer can be substantially accelerated so that the fluorine-containing polymer is obtainable more easily and in high yields. In choosing the second and third comonomers, the reactivities of the individual comonomers are tailored to one another via their degree of fluorination. If one comonomer has a high degree of fluorination, the electron density of the polymerizable carbon-carbon double bond decreases and hence its reactivity in the free radical polymerization. In the extreme case, the monomer therefore can no longer be polymerized. This poor polymerizability is counteracted by the high electron density of the polymerizable carbon-carbon double bond of the other comonomer. This comonomer therefore has a lower degree of fluorination. The polymer of the photoresist according to the invention thus can be divided into two general embodiments. In the first embodiment, the second comonomer has a high degree of fluorination and hence a low electron density of the polymerizable carbon-carbon double bond and the third comonomer has a low degree of fluorination and a high electron density. Here, the second comonomer acts as an electron acceptor and the third comonomer as an electron donor. In the second embodiment, the second comonomer has a low degree of fluorination and hence a high electron density of the polymerizable carbon-carbon double bond and the third comonomer has a high degree of fluorination and a low electron density. Here, the second comonomer therefore acts as an electron donor while the third comonomer acts as an electron acceptor. The terms high and low degree of fluorination and high and low electron density are not to be regarded as absolute in this context but are based on a relative comparison of the two comonomers.

In order to achieve as high a transparency of the polymer as possible at 157 nm, the repeating unit formed from the third comonomer is completely saturated; i.e. it no longer includes a carbon-carbon double bond. In addition to hydrogen and fluorine, the carbon skeleton of the third comonomer may also carry further substituents, for example alkoxy groups, which have a low absorption at 157 nm. Furthermore, individual carbon atoms in the carbon skeleton of the third comonomer also may be replaced by heteroatoms, in particular oxygen. For the copolymerization, the third comonomer has exactly one polymerizable carbon-carbon double bond. Because the corresponding functional groups are already provided in the first and second comonomers, the third comonomer has no acid-cleavable group and no anchor group.

An anchor group is introduced into the polymer of the photoresist according to the invention by adding the second comonomer. An anchor group is understood as meaning a group that permits subsequent linkage of an amplification agent that has for this purpose a corresponding group, in particular a nucleophilic group. The amplification agent is preferably bonded to the polymer via a covalent bond. A distinction is made between reactive anchor groups that can react directly with the amplification agent without prior activation or elimination of protection, by virtue of the fact that the amplification agent nucleophilically attacks the reactive anchor groups with formation of a covalent bond, and unactivated anchor groups, which are generally present in protected form and do not react with the amplification agent until after elimination of protection. Such groups are, for example, carboxyl groups which are protected with an acid-labile group and, after elimination of protection, can bind an amplification agent via an ionic bond, for example as an ammonium salt, or a covalent bond, for example an amide bond.

Groups cleavable under acid catalysis are introduced into the polymer via the first comonomer. In order to increase the transparency of the polymer at 157 nm, the first comonomer is fluorinated. Preferably, the first comonomer has as high a degree of fluorination as possible. Cleavage of the group cleavable under acid catalysis liberates a polar group that increases the polarity of the polymer and thus increases the solubility of the polymer in polar, preferably alkaline aqueous developers. Such polar groups are, for example, carboxyl groups or acidic hydroxyl groups. Unsaturated carboxylic acids or unsaturated acidic alcohols whose carboxyl group or hydroxyl group, respectively, is esterified or etherified with an acid-labile group can therefore preferably be used as the first comonomer. Those groups that can be eliminated under acid catalysis are preferably used as acid-labile groups. The first comonomer preferably includes tert-alkyl ester, tert-butyl ester, tert-butoxycarbonyloxy, tetrahydrofuranyloxy, tetrahydropyranyloxy, or acetal groups as groups cleavable under acid catalysis. Tert-Butyl ester groups are particularly preferred. The first comonomer is preferably selected from a group including mono- or polyfluorinated methacrylic acid, mono- or polyfluorinated acrylic acid, mono- or polyfluorinated cyclohexenecarboxylic acid, and mono- or polyfluorinated norbornenecarboxylic acid, the carboxyl group of the acid being esterified with an acid-labile protective group.

For example, the repeating units in the polymer that are shown below are obtained from the preferably used first comonomers, which may also be further substituted.

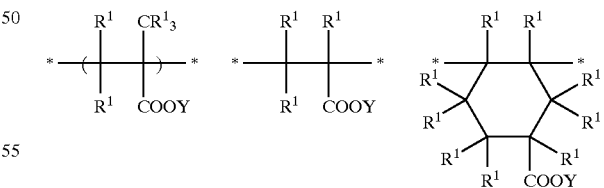

Here, $R^1$ in each case independently for each position, is a hydrogen or fluorine atom or is an alkyl group having 1 to 10 carbon atoms which may also be completely or partly fluorinated. In each case, at least one $R^1$ in each polymer building block is a fluorine atom. Y is an acid-labile protective group from which, for example, the abovementioned groups cleavable under acid catalysis are formed. The film-forming polymers may also contain a plurality of the repeating units shown. In a preferred embodiment, the acid-labile group Y is at least partly fluorinated. In this case, unsaturated carboxylic acids that are not fluorinated may also be used. The increase in the transparency of the polymer at a wavelength of 157 nm is then caused by the fluorination of the acid-labile groups. This has the advantage that, after elimination of the acid-labile groups, the polymer is more readily soluble in the alkaline developer.

Examples of first comonomers that produce acidic hydroxyl groups in the polymer after elimination of the acid-labile group are shown below.

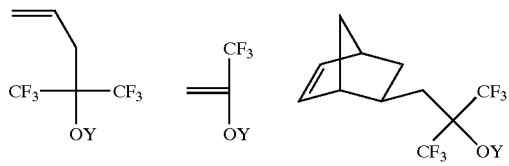

Here, Y is an acid-labile group, as above. In the first comonomers shown, one or more of the hydrogen atoms may also be replaced by fluorine atoms.

The polymers contained in the photoresist according to the invention can be prepared by conventional polymerization processes. The free radical polymerization is initiated by adding a free radical initiator, for example benzoyl peroxide or AIBN, or by high-energy radiation. The polymerization can be carried out in solution or by mass polymerization without a solvent.

In addition to the polymer, the photoresist according to the invention contains a photo acid generator. Photo acid generators that may be used are all compounds that liberate acid on irradiation with an exposure radiation of 157 nm and have as high a quantum yield as possible. Ionic compounds in the form of sulfonium salts and iodonium salts are preferably used as photo acid generators. For example, onium compounds, as described in DE 19 82 0477, are suitable.

For example, methoxypropyl acetate, oligoethylene glycol ether, cyclopentanone, cyclohexanone, γ-butyrolactone or ethyl lactate may be used as a solvent for the photoresist. Mixtures of at least two of these solvents may also be used. In general, all conventional photoresist solvents or mixtures thereof may be used, provided that a clear, homogeneous solution of the resist components which has a long shelf life can be prepared with them and a good layer quality of the resist film is achieved on coating of a substrate.

The components described so far are preferably used in the resist according to the invention in the following ratios:

film-forming polymer: from 1 to 50% by weight, preferably from 2 to 8% by weight;

photo acid generator: from 0.01 to 10% by weight, preferably from 0.05 to 0.5% by weight; and solvent: from 50 to 99% by weight, preferably from 92 to 97% by weight.

In addition to the components, the chemically amplified resist may also contain further conventional components. For example, a thermo acid generator, which liberates an acid on heating, may be present. The temperature at which the thermo acid generator liberates an acid must be above the temperature at which the elimination of the acid-labile groups in the exposed parts of the photoresist takes place. The thermo acid generator is generally contained in the photoresist in an amount of from 0.01 to 5% by weight, preferably from 0.05 to 1% by weight. Suitable thermo acid generators are, for example, benzylthiolanium compounds.

With the aid of the thermo acid generator, the acid-labile groups can be eliminated in the structured resist by heating, and polar groups which serve as anchor groups for linkage of the amplification agent are thus liberated.

In addition, further components that have an advantageous effect on the resist system with regard to resolution, film formation properties, shelf life, radiation sensitivity, pot life effects, etc. can be added to the photoresist as additives.

The effect which a fluorine atom has on the electron density of the polymerizable carbon-carbon double bond is particularly great if the fluorine atom is bonded directly to one of the carbon atoms of the polymerizable carbon-carbon double bond. According to a preferred embodiment, at least one of the second and third comonomers carries at least one fluorine atom that is bonded to a carbon atom of the polymerizable carbon-carbon double bond, the number of fluorine atoms bonded to the carbon atoms of the polymerizable carbon-carbon double bond differing between the second and the third comonomer.

If one of the second and third comonomers carries a fluorine atom on one of the carbons of the polymerizable double bond, the other comonomer has no fluorine atom on the carbons of the polymerizable double bond. If one of the second and third comonomers has two fluorine atoms on the carbons of the polymerizable double bond, the other comonomer has no fluorine atom or one fluorine atom on the carbons of the polymerizable double bond. If, finally, one of the second and third comonomers has three fluorine atoms on the carbons of the polymerizable double bond, for example in alkenes having a terminal double bond, the other comonomer has no fluorine atoms, one fluorine atom or two fluorine atoms on the carbons of the polymerizable double bond. Particularly preferably, in each case, one of the second and third comonomers has no fluorine atom on the carbons of the polymerizable double bond.

In order on the one hand to ensure that the degree of fluorination of the polymer is as high as possible but on the other hand to obtain a sufficiently high reactivity in the free radical polymerization of the comonomers, one of the second and third comonomers is preferably perfluorinated on the carbon atoms of the polymerizable carbon-carbon double bond and the carbon atoms of the polymerizable double bond of the other comonomer are not fluorinated. In this preferred embodiment, the carbon atoms of the polymerizable double bond of the second or third comonomer acting as an electron acceptor therefore carry two fluorine atoms or, in the case of terminal double bonds, two or three fluorine atoms.

The third comonomer preferably has a structure in which no further functional groups are contained in the molecule apart from the polymerizable double bond. Functional groups are understood as meaning those groups that readily undergo a chemical reaction and are usually used in organic synthesis to assemble larger molecules in a planned manner. Such groups are, for example, nucleophilically attackable groups or groups which are themselves nucleophilic. The third comonomer is preferably selected from the group including alkenes having at least 3 carbon atoms, cycloalkenes having at least 5 carbon atoms and ethers having at least 3 carbon atoms. The alkenes may be straight-chain or branched and may have the polymerizable carbon-carbon double bond in a terminal position or inside the carbon skeleton. The alkenes preferably have not more than 20 carbon atoms, in particular not more than 10 carbon atoms. The cycloalkenes preferably include 5- or 6-membered rings and may be substituted by straight-chain or branched alkyl groups or alkenyl groups or alkoxyalkylene groups. The polymerizable carbon-carbon double bond may be contained in the ring or in an alkenyl group which is bonded as a substituent to the ring. The cycloalkenes preferably include not more than twenty (20), in particular not more than ten (10), carbon atoms. Finally, monounsaturated ethers, which are preferably fluorinated, are also preferably used as a third comonomer. Here, vinyl and allyl ethers are particularly preferred owing to their ready availability. In addition to the unsaturated radical containing the polymerizable carbon-carbon double bond, the ether may include straight-chain or branched alkyl radicals, and cycloalkyl radicals which in turn may be substituted by alkyl groups. The ether preferably includes not more than 20 carbon atoms, particularly preferably not more than 10 carbon atoms.

These groups may also be monofluorinated or polyfluorinated, in each case depending on the desired electron density of the polymerizable double bond, the degree of fluorination depending on whether the third comonomer acts as an electron donor or as an electron acceptor.

Regardless of whether fluorine atoms are bonded to the carbon atoms of the polymerizable double bond, the third comonomer preferably carries at least one fluorine atom on the carbon atoms which do not form the polymerizable carbon-carbon bond. In this way, the transparency of the polymer contained in the photoresist according to the invention can be increased at a wavelength of 157 nm, the electron density of the polymerizable carbon-carbon double bond remaining substantially uninfluenced.

The third comonomer is preferably perfluorinated on the carbon atoms that do not form the polymerizable carbon-carbon bonds.

If the third comonomer acts as an electron acceptor, i.e. has an electron-poor polymerizable carbon-carbon double bond, the third comonomer is preferably perfluorinated. This means that all hydrogen atoms of the monomer forming the parent structure are replaced by fluorine atoms.

If, on the other hand, the third comonomer acts as an electron donor, it preferably carries no fluorine atoms on the carbon atoms of the polymerizable carbon-carbon bond. In this case, hydrogen atoms are preferably bonded to the polymerizable carbon-carbon double bond.

If the electron density on the polymerizable carbon-carbon double bond of the third comonomer is to be further increased, an electron-shifting substituent can be bonded to one of the carbon atoms of the polymerizable double bond. For this purpose, the third comonomer preferably carries a methyl group or a cyano group on at least one carbon atom of the polymerizable carbon-carbon double bond. Polymers having cyano groups have a higher transparency in comparison with the analogous unsubstituted hydrocarbons. Furthermore, monomers having cyano groups neighboring the carbon-carbon double bond are distinguished by good copolymerizability with electron-poor double bonds.

As already described, the photoresist according to the invention contains, in the first embodiment, polymers which are derived from third comonomers which act as electron donors having an electron-rich polymerizable carbon-carbon double bond.

Examples of particularly suitable third comonomers having an electron-rich double bond are alkenes having a non-terminal double bond and at least partly fluorinated side groups. The alkyl chains bonded to the double bond are designated as side groups. Such compounds have, for example, a structure of the general Formula I

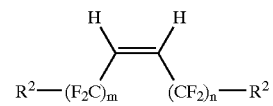

Formula I in which $R^2$, in each case independently for each position, is: H, F, CN, $CH_3$, or $CF_3$ and m and n are each an integer from 1 to 10.

Examples of compounds having perfluorinated side groups are 2H,3H-perfluoro-2-heptene, 3H,4H-perfluoro-3-octene and 4H,5H-perfluoro-4-decene.

Examples of alkenes having a terminal double bond are compounds of the general Formula II:

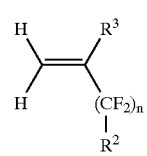

Formula II in which $R^2$ and n have the abovementioned meaning and $R^3$ is H, CN, or $CH_3$.

Examples of alkenes having a terminal double bond and perfluorinated side chain are 1H,1H,2H-perfluoro-1-hexene and 1H,1H,2H-perfluoro-1-octene. The side chains in these alkenes may also be branched.

Furthermore, cycloalkenes of the general Formula III are suitable as third comonomers having an electron-rich carbon-carbon double bond

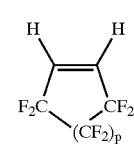

Formula III in which p is an integer from 1 to 4.

Examples of fluorine-containing cycloalkenes having nonfluorinated carbon atoms of the double bond are 1H,2H-perfluorocycloheptene and 1H,2H-perfluorocyclooctene.

Examples of ethers that can be used as a third comonomer having an electron-rich polymerizable carbon-carbon double bond are compounds of the general Formula IV

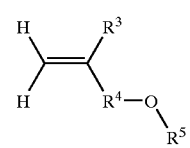

Formula IV in which $R^3$ has the abovementioned meaning, $R^4$ is a single bond or a divalent alkylene radical having 1 to 10 carbon atoms in which one or more hydrogen atoms may also be replaced by fluorine atoms, the alkylene radical being perfluorinated in a particularly preferred embodiment, and $R^5$ is a monovalent alkyl group having 1 to 10 carbon atoms, which may be straight-chain or branched and in which one or more hydrogen atoms may be replaced by fluorine atoms, the alkyl radical preferably being perfluorinated. Examples of such ethers are 2H-perfluoropropyl, 2-propenyl ether, and perfluoropropyl vinyl ether.

These third comonomers having electron-rich polymerizable carbon-carbon double bonds are reacted with second comonomers which have an electron-poor polymerizable carbon-carbon double bond.

In the second embodiment, the polymer of the photoresist according to the invention is derived from third comonomers, which have an electron-poor polymerizable carbon-carbon double bond.

Preferred alkenes having a non-terminal double bond are compounds of the general Formula V

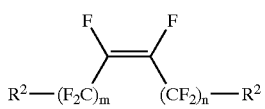

Formula V in which $R^2$, m, and n have the abovementioned meaning. Examples of suitable monomers are perfluoro-2-heptene, perfluoro-3-octene and perfluoro-4-decene.

Preferred alkenes having a terminal double bond are compounds of the general Formula VI

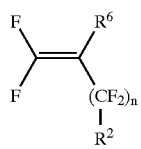

Formula VI in which $R^2$ and n have the abovementioned meaning and $R^6$ is H, F, CN, $CH_3$, or $CF_3$. Examples of suitable compounds are 1-perfluorohexene, 1-perfluoroheptene, and 1-perfluorooctene.

Preferred cycloalkenes are compounds of the general Formula VII

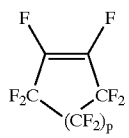

Formula VII in which p has the abovementioned meaning. Preferred examples are perfluorocyclohexene, perfluorocycloheptene, and perfluorocyclooctene.

Finally, suitable ethers have a structure of the general Formula VIII

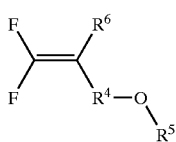

Formula VIII in which $R^4$, $R^5$, and $R^6$ have the abovementioned meaning. Preferred monomers are perfluoropropyl propylene ether and trifluoromethyl trifluorovinyl ether.

In the preparation of the polymer of the photoresist according to the invention, these third comonomers are combined with second comonomers which have an electron-rich polymerizable carbon-carbon double bond.

An anchor group is introduced into the polymer of the photoresist according to the invention by using a second comonomer. The anchor group may be, for example, a carboxyl group which is preferably protected by an acid-labile group. Examples are acrylic acid, methacrylic acid, cyclohexenecarboxylic acid, norbornenecarboxylic acid, maleic acid, itaconic acid, cyclohexenedicarboxylic acid, norbornenedicarboxylic acid, and the acidic monoesters of these dicarboxylic acids with any desired alcohols, for example methanol or ethanol. If these carboxylic acids are protected by an acid-labile group, first and second comonomers may also be identical. However, the anchor group is preferably in the form of a reactive anchor group since in this case the polymer can be reacted with an amplification agent without prior activation or elimination of protection. Particularly preferably, the second comonomer has a carboxylic anhydride group as an anchor group. Examples of suitable comonomers are maleic anhydride, itaconic anhydride, cyclohexene-dicarboxylic anhydride, norbornene-dicarboxylic anhydride and methacrylic anhydride. In the comonomers, one or more hydrogen atoms may be replaced by fluorine atoms and, where the second comonomer acts as an electron donor, the carbon atoms of the polymerizable double bonds are preferably not substituted by fluorine atoms but carry hydrogen atoms.

If the second comonomer acts as an electron acceptor and has a low electron density of the polymerizable carbon-carbon double bond, the second comonomer preferably carries at least one fluorine atom or one trifluoromethyl group on at least one carbon atom of the polymerizable carbon-carbon double bond. Exemplary compounds are trifluoromethacrylic acid and fluoromaleic anhydride.

In this case, the second comonomer is particularly preferably perfluorinated. Examples of suitable monomers are difluoromaleic anhydride, perfluoroitaconic anhydride, perfluorocyclohexenedicarboxylic anhydride and perfluoronorbornene-dicarboxylic anhydride.

With the second and third comonomers described above, it is possible to prepare, for example, the following repeating units.

Examples of the first embodiment, which start from second comonomers having an electron-poor polymerizable carbon-carbon double bond and third comonomers having an electron-rich polymerizable carbon-carbon double bond, are shown below. In each case, difluoromaleic anhydride, as electron acceptor, was used as the second comonomer.

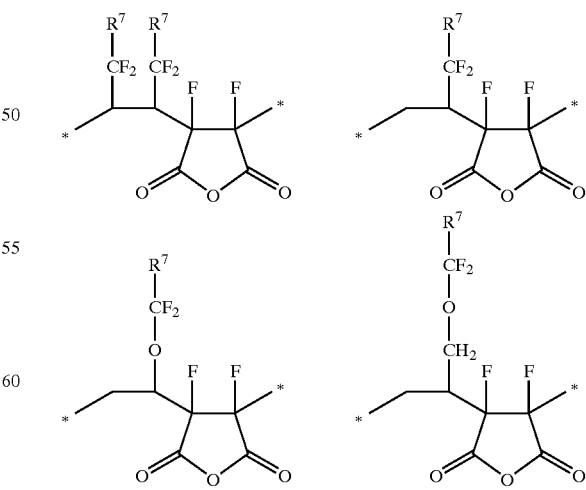

in which $R^7$ is a fluorine atom, a monovalent perfluorinated alkyl, or cycloalkyl radical.

Examples of the second embodiment, which start from second comonomers having an electron-rich polymerizable carbon-carbon double bond and third comonomers having an electron-poor polymerizable carbon-carbon double bond, are shown below. In each case, itaconic anhydride, as electron donor, was used as the second comonomer.

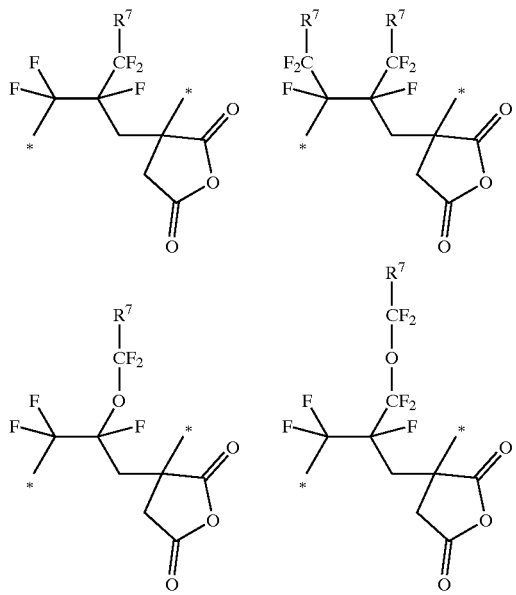

in which $R^7$ has the abovementioned meaning.

In order to obtain the polymer of the photoresist according to the invention, these repeating units are also supplemented by the repeating units derived from the first comonomer. Suitable examples of the first comonomer are tert-butyl trifluoromethylacrylate, tert-butyl perfluoromethylacrylate, and tert-butyl perfluoroacrylate.

The photoresist according to the invention is applied to the substrate by conventional techniques, for example by spin-coating or spraying on. The substrate used is in general a silicon wafer that may already have undergone structuring steps and may therefore already include structures or microelectronic components. In this case, a bottom resist also can be first applied in order to compensate irregularities on the surface of the substrate and to be able to ensure reliable focusing of the radiation used for the exposure in the layer of the resist according to the invention. After removal of the solvent by drying, the dried resist layer is exposed. As a result of the exposure, a proton is liberated from the photo acid generator and leads to the elimination of the acid-labile protective groups in the exposed parts. The acid first forms a latent image, i.e. the distribution of the acid in the photoresist corresponds to the exposed parts. As a result of the elimination of the acid-labile groups, polar groups are liberated on the polymer and the latent acid image is imprinted into the polymer. The polymer changes its chemical character, i.e. parts in which the polymer has an increased polarity are formed in the resist. Therefore, a chemical profile is produced in the surface in the photoresist. By heating the resist, the elimination of the acid-labile groups is accelerated. Since the proton acts as a catalyst in the elimination of the acid-labile protective groups, a multiplicity of acid-labile protective groups can be eliminated by one liberated proton. This leads to a stronger contrast of the latent image produced by the exposure. As a result of the elimination of the acid-labile protective groups, alkali-soluble groups, such as carboxyl groups or acidic hydroxyl groups, are liberated. As a result of the elimination of acid-labile protective groups, the solubility of the polymer in the alkaline aqueous developers differs between the exposed and unexposed parts. If, therefore, the resist is treated with an alkaline aqueous developer, for example tetramethylammonium hydroxide, only the exposed parts of the substrate are removed. A structured resist is now obtained on the substrate. The resist can then be modified in its properties, for example its etch resistance with respect to an oxygen plasma, by treatment with an amplification agent. If the anchor groups are already present in a reactive form in the polymer, for example as a carboxylic anhydride group, a solution of the amplification agent can be applied directly to the already structured resist. If the anchor groups are present in protected form, they are first liberated. For this purpose, the structured resist can, for example, be exposed to a floodlight and then heated. The polar groups are now also liberated in the unexposed parts of the photoresist and then act as anchor groups for the linkage of the amplification agent. It is possible to use as an amplification agent, for example, aromatic compounds which effect an increase in the layer thickness so that the time during which the resist structure is removed in an etching plasma is increased. As an alternative, silicon-containing amplification agents may be used. In an oxygen plasma, an $SiO_2$ film then forms and protects the resist layers underneath from removal by the oxygen plasma.

The amplification agent may be applied to the structured resist from the gas phase or as a solution in a suitable solvent.

Suitable basic silylation reagents are amino-functionalized organosilicon compounds, such as, for example, aminosiloxanes. For example, chain-like dimethylsiloxanes having terminal aminopropyl units and 1 to 50, preferably 2 to 12, silicon atoms per molecule are particularly suitable. Such amplification agents are represented, for example, by the following general structural formulae:

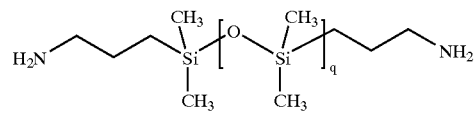

where q=0–49.

Further examples of amplification agents having amino-functional groups but also having other functional groups are shown below:

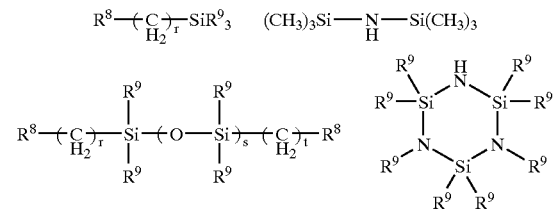

in which s is an integer from 0 to 30, r and t, in each case independently, are an integer from 0 to 10, $R^9$ is H, alkyl, aryl or cycloalkyl, and $R^8$ is selected from the following group

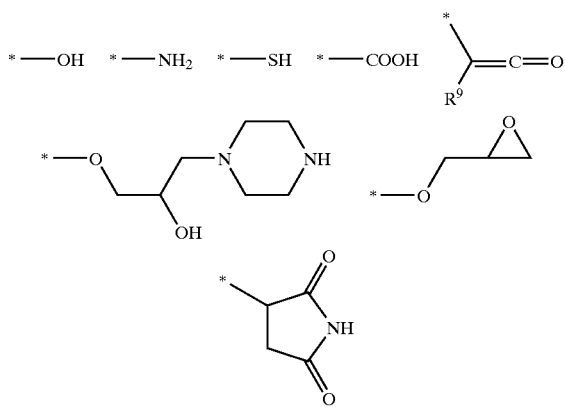

Silsesquioxanes are also suitable as amplification agents.

If the amplification agent is applied in solution to the resist, suitable solvents are, for example, hexanol, isopropanol, heptane, decane, or a mixture of at least two of these solvents. In general, however, it is possible to use all customary solvents that are not acidic or basic, or mixtures thereof, which are capable of taking up the components of the amplification agent to give a clear, homogeneous solution having a long shelf life.

The reaction of the amplification agent with the anchor groups of the film-forming monomers can be improved by reaction accelerators. Suitable reaction accelerators for the silylation for swelling and stabilizing the reaction products are, for example, water, low molecular weight alcohols, such as, for example, methanol or ethanol, and low molecular weight aldehydes and ketones, such as, for example, acetone.

The photoresist according to the invention permits structuring by exposure to radiation having a wavelength that is shorter than the wavelengths used to date in production. The resist is therefore preferably exposed to a radiation that has a wavelength of less than 200 nm, preferably 193 nm and particularly preferably 157 nm.

The invention is explained in more detail with reference to examples.

Other features that are considered as characteristic for the invention are set forth in the appended claims.

Although the invention is illustrated and described herein as embodied in a fluorine-containing photoresist having reactive anchors for chemical amplification and improved copolymerization properties, it is, nevertheless, not intended to be limited to the details shown since various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying examples.

DESCRIPTION OF THE PREFERRED EMBODIMENTS

The following examples describe embodiments of the invention.

EXAMPLE 1
(Second Comonomer as Electron Acceptor)

A polymer having a composition corresponding to the first variant was prepared by subjecting the acceptor monomer difluoromaleic anhydride (30 mol %) and the donor monomer 1H,1H,2H-perfluorooctene (50 mol %) and tert-butyl trifluoromethacrylate (20 mol %) as a first comonomer having a group cleavable under acid catalysis to free radical polymerization with AIBN as an initiator in butanone. After polymerization was complete (12 hours), a part of the difluoromaleic anhydride was cleaved by methanol to give the acidic monoester. For purification, the polymer was first precipitated in heptane. A photoresist including a 3% strength by weight solution of the polymer in methoxypropyl acetate and a photo acid generator was produced from the dried polymer. Evidence of the structurability of the resist polymer prepared above was then obtained at exposure wavelengths of 248 and 157 nm. The exposure produced a strong acid which, in a subsequent heating step, eliminated the tert-butyl protective groups and thus rendered the polymer soluble in an aqueous developer.

The structure of the polymer is shown in Formula IX.

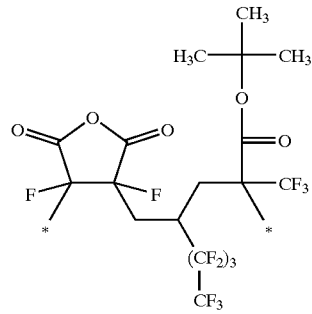

Formula IX

The repeating units derived from the individual comonomers are present in a ratio of 30:50:20.

EXAMPLE 2
(Second Comonomer as Electron Donor)

A polymer having a composition corresponding to the second variant was prepared by subjecting the monomers cyclohexenedicarboxylic anhydride (50 mol %) as a donor and tert-butyl trifluoromethylacrylate (25 mol %) and perfluorocyclohexene (25 mol %) as acceptors to free radical polymerization with AIBN as an initiator in butanone. Here too, after the polymerization was complete (12 hours), a part of the cyclohexenedicarboxylic anhydride was cleaved by methanol to give the acidic monoester. For purification, the polymer was then precipitated in heptane. A photoresist of the dried polymer including a 3% strength by weight solution of the polymer in methoxypropyl acetate and a photo acid generator was structured at an exposure wavelength of 248 and 157 nm. The formula X below shows the fundamental structure of the polymer. The repeating units derived from the individual comonomers are present in a ratio of 25:50:25.

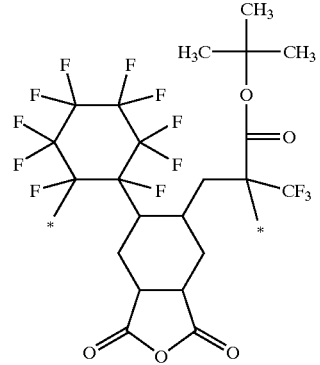

Formula X

I claim:

1. A chemically amplified photoresist, comprising:
   a film-forming fluorine-containing polymer copolymerized from
      a first fluorine-containing comonomer having a polymerizable carbon-carbon double bond and a group cleavable under acid catalysis,
      one second comonomer different from said first comonomer having a polymerizable carbon-carbon double bond and a nucleophilically attackable anchor group for binding an amplification agent, and
      a third comonomer having exactly one polymerizable carbon-carbon double bond and an otherwise saturated carbon skeleton, said saturated skeleton having no group cleavable under acid catalysis and no anchor group,
      at least one of said second and third comonomer having a fluorine atom substituent to make said respective polymerizable carbon-carbon double bond electron-poor and act as an electron acceptor when polymerized, and said carbon-carbon double bond of the other of said second and third comonomers being electron-rich to act as an electron donor when polymerized;
   a photo acid generator; and
   a solvent.

2. The photoresist according to claim 1, wherein said anchor group is a protected anchor group.

3. The photoresist according to claim 1, further comprising a further solvent to form a solvent mixture.

4. The photoresist according to claim 1, wherein:
   at least one of said second or third comonomers carries a fluorine atom bonded to a carbon atom of said polymerizable carbon-carbon double bond; and
   a number of fluorine atoms bonded to carbon atoms of said polymerizable carbon-carbon double bond differs between said second and said third comonomer.

5. The photoresist according to claim 1, wherein:
   one of said second and third comonomers is perfluorinated on carbon atoms of said polymerizable carbon-carbon double bond; and
   said carbon atoms of said polymerizable double bond of said other of said second and third comonomers are not fluorinated.

6. The photoresist according to claim 1, wherein said third comonomer is selected from the group consisting of alkenes having at least 3 carbon atoms, cycloalkenes having at last 5 carbon atoms, and unsaturated ethers having at least 3 carbon atoms.

7. The photoresist according to claim 6, wherein said third comonomer has carbon atoms not forming said polymerzable carbon-carbon bond and is perfluorinated on said carbon atoms not forming said polymerizable carbon-carbon bonds.

8. The photoresist according to claim 1, wherein said third comonomer has a carbon atom not forming said polymerizable carbon-carbon bond and a fluorine atom on said carbon atom not forming said polymerizable carbon-carbon bond.

9. The photoresist according to claim 1, wherein said third comonomer is perfluorinated.

10. The photoresist according to claim 1, wherein said third comonomer carries no fluorine atoms on said carbon atoms of said polymerizable carbon-carbon bond.

11. The photoresist according to claim 1, wherein said third comonomer carries, on at least one carbon atom of said polymerizable carbon-carbon double bond, a substituent selected from the group consisting of a methyl group and a cyano group.

12. The photoresist according to claim 1, wherein said anchor group of said second comonomer is a carboxylic anhydride group.

13. The photoresist according to claim 1, wherein said second comonomer carries, on at least one carbon atom of said polymerizable carbon-carbon double bond, a substituent selected from the group consisting of a fluorine atom and a trifluoromethyl group.

14. The photoresist according to claim 1, wherein said first comonomer has a group being cleavable under acid catalysis and at least monofluorinated.

* * * * *